United States Patent [19]
Look et al.

[11] Patent Number: 5,486,707
[45] Date of Patent: Jan. 23, 1996

[54] ANTIFUSE STRUCTURE WITH DOUBLE OXIDE LAYERS

[75] Inventors: Kevin T. Look, Fremont; Evert A. Wolsheimer, Sunnyvale, both of Calif.

[73] Assignee: Xilinx, Inc., San Jose, Calif.

[21] Appl. No.: 182,519

[22] Filed: Jan. 10, 1994

Related U.S. Application Data

[63] Continuation of Ser. No. 933,428, Aug. 21, 1992, abandoned.

[51] Int. Cl.$^6$ .............................. H01L 29/04; H01L 27/02
[52] U.S. Cl. ................................. 257/52; 257/50; 257/530
[58] Field of Search ................... 257/DIG. 50, DIG. 52, 257/DIG. 530

[56] References Cited

U.S. PATENT DOCUMENTS

| | | | |
|---|---|---|---|
| 5,070,384 | 12/1991 | McCollum et al. | 257/50 |
| 5,181,096 | 1/1993 | Forouhi | 257/530 |

FOREIGN PATENT DOCUMENTS

416903A2  5/1990  European Pat. Off. .

OTHER PUBLICATIONS

Cook et al., "Amorphous Si antifuse technology for bipolar Proms", Bipolar Circuits and Technology Meeting, IEEE, pp. 99–100, 1986.

*Primary Examiner*—Rolf Hille
*Assistant Examiner*—Valencia Martin Wallace
*Attorney, Agent, or Firm*—Jeanette S. Harms; Edel M. Young

[57] ABSTRACT

An antifuse for programmable integrated circuit devices is formed above a refractory metal on a thin native oxide layer and comprises an amorphous compound resulting from an PECVD deposition using a combination of silane gas and nitrogen. After formation of the amorphous antifuse layer, the layer is implanted with an atomic species such as argon. The thin oxide layer is formed on the surface of a refractory metal, therefore the process of forming the oxide is slow, the oxide is of even thickness, and the thickness can be controlled precisely. In a preferred embodiment, a second thin oxide layer is formed above the doped amorphous layer. The oxide layers significantly reduce the leakage current of an unprogrammed antifuse. Because of these thin oxide layers and the implantation step, the amorphous layer may be as thin as 200 Å.

20 Claims, 2 Drawing Sheets

5,486,707

1

ANTIFUSE STRUCTURE WITH DOUBLE OXIDE LAYERS

This application is a continuation of application Ser. No. 07/933,428, filed Aug. 21, 1992 now abandoned.

FIELD OF THE INVENTION

This invention relates to antifuses used in programmable integrated circuit devices, a method for forming antifuses, and a method for programming the antifuses.

BACKGROUND OF THE INVENTION

In programmable logic integrated circuit devices, antifuses may be used to programmably connect conductive lines to each other. An antifuse is a structure which is non-conductive when manufactured but which can be caused to become permanently conductive by application of sufficient voltage across its terminals.

The art of forming antifuses which may be reliably used in integrated circuit devices has evolved over the last ten years, with a variety of antifuse structures becoming commercially available.

FIG. 1 shows one prior art antifuse structure manufactured using a known process. A lower conductive terminal 11 is formed of polycrystalline silicon. As shown in the view of FIG. 1, poly layer 11 may be thought of as extending perpendicular to the plane of the drawing. Formed on the poly line is an insulation layer 13, which is patterned to form an opening 13a for antifuse contact. An amorphous silicon layer 14 about 1500 Å thick is formed on this insulation layer, using silane gas (SiH$_4$) in a low pressure chemical vapor deposition process at a temperature of about 560° C. This amorphous layer 14 is patterned to form antifuse 14a. Formed above antifuse 14a are layers of titanium metal 15, then titanium nitride 16, then aluminum or an aluminum-silicon alloy 17. These three layers 15, 16, and 17 are patterned simultaneously to form a conductive line which makes contact to the upper terminal of antifuse 14a.

FIG. 2 shows another prior art antifuse structure. The lower conductive terminal is formed from aluminum or aluminum-silicon alloy 21 on which is formed titanium-tungsten layer 22. After a dielectric layer 23 (silicon dioxide for example) is formed and patterned to expose a titanium-tungsten contact area 23a, amorphous silicon antifuse 24a is formed by depositing amorphous silicon 24 using a PECVD process, and patterning the amorphous silicon 24 to leave the antifuse 24a extending into the contact 23a and contacting the lower conductive layer 22.

PECVD amorphous silicon has relatively low conductivity. However, the conductivity is sufficient that either the antifuse will have an undesirably high leakage in its unprogrammed state or the antifuse must be thick enough to require high programming voltage. To reduce leakage to an acceptable level, the amorphous silicon layer 24 is made to be about 1500 Å thick.

Upper conductive layers of titanium 25, titanium-tungsten 26, and aluminum or aluminum-silicon alloy 27 are formed above antifuse 24a.

Prior art antifuse structures are discussed in European Patent Application EP 0 416 903 A2 of QuickLogic entitled "Method of Fabricating a Programmable Interconnect Structure" and in McCollum et al., U.S. Pat. No. 5,070,384 assigned to Actel Corporation. The Actel structure includes a dielectric layer between the lower refractory metal and the amorphous silicon layer and is shown in FIG. 5. FIG. 5 is taken directly from U.S. Pat. No. 5,070,384 and the reference numerals have not been changed. In FIG. 5, layer 20 is titanium, and layer 24 is a thin dielectric layer which may be formed by oxidizing the surface of titanium layer 20 and may be approximately 100 Å thick. Layer 26 is amorphous silicon on the order of 2000 Å thick and may be doped with phosphorus or arsenic to a level of about $10^{20}$ atoms/cm$^3$ to lower resistance. Upper electrode 28 may be of tungsten, molybdenum, platinum, titanium, titanium nitride, tantalum, silicides of those metals, or arsenic doped polysilicon.

The past antifuses have required a fairly high programming voltage, on the order of 12–14 volts. Indeed the Actel patent describes programming at 20 volts (see col. 9 line 1). Standard transistors used in 5-volt systems typically break down at about 12–14 volts, which means that special processing is needed to enhance the breakdown characteristic of the transistors for programming the antifuses, and care has to be taken for isolating other structures from antifuse programming voltages. Also, in a submicron process with a relatively thick layer of amorphous silicon, step coverage of the top electrode extending into the antifuse via opening is undesirably poor.

SUMMARY OF THE INVENTION

According to the present invention, an antifuse structure is provided which is programmable at a relatively low programming voltage and which simultaneously has an acceptable leakage current in its unprogrammed state.

Rather than the prior art amorphous silicon layer between two conductive layers, an antifuse is formed above a refractory metal on a thin native oxide layer and comprises an amorphous compound resulting from a PECVD deposition using a combination of silane gas and nitrogen. After formation of the amorphous antifuse layer, the layer is implanted with a large ion such as argon, arsenic, silicon, or phosphorus. The thin oxide layer is formed on the surface of a refractory metal, therefore the process of forming the oxide is slow, the oxide is of even thickness, and the thickness can be controlled precisely. In a preferred embodiment, a second thin oxide layer is formed above the doped amorphous layer. The oxide layers significantly reduce the leakage current of an unprogrammed antifuse. Because of the combination of thin oxide layers and implantation, the amorphous layer may be as thin as 450 Å.

In contrast to the prior art antifuse thickness of 1500 Å to 2500 Å with a resulting programming voltage of 12–14 volts, a structure manufactured according to the present invention can be programmed at a programming voltage of 8–9 volts. Thus ordinary transistors which break down at 12–14 volts can be used both for programming antifuses and for electrical isolation from the antifuse programming voltages.

DETAILED DESCRIPTION OF A PREFERRED EMBODIMENT

Figure 1:
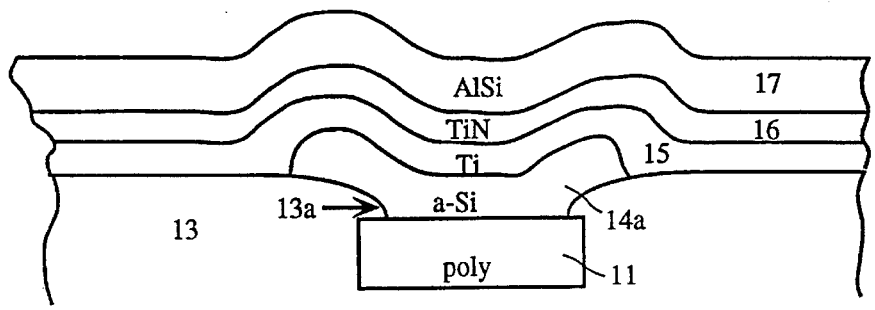
FIG. 1 shows one prior art antifuse structure.
Figure 2:
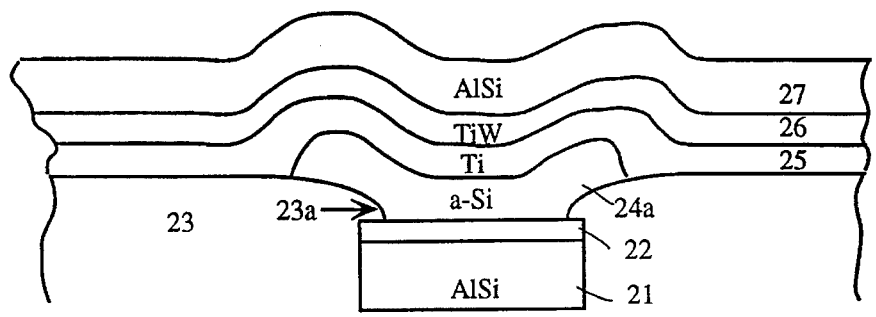
FIG. 2 shows another prior art antifuse structure.
Figure 5:
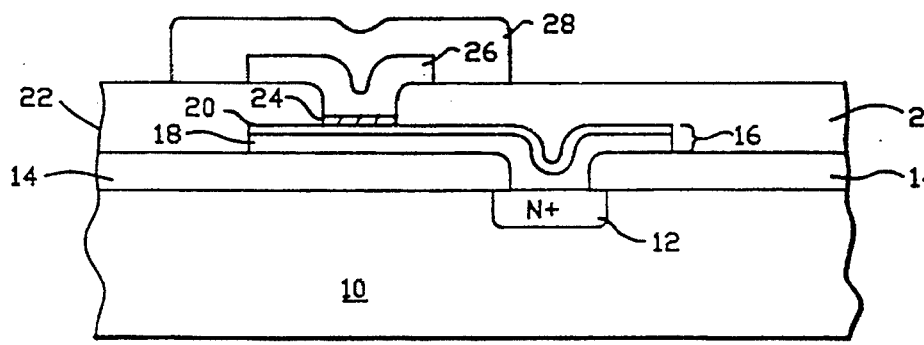
FIG. 5 shows another prior art antifuse structure.
Figure 3:
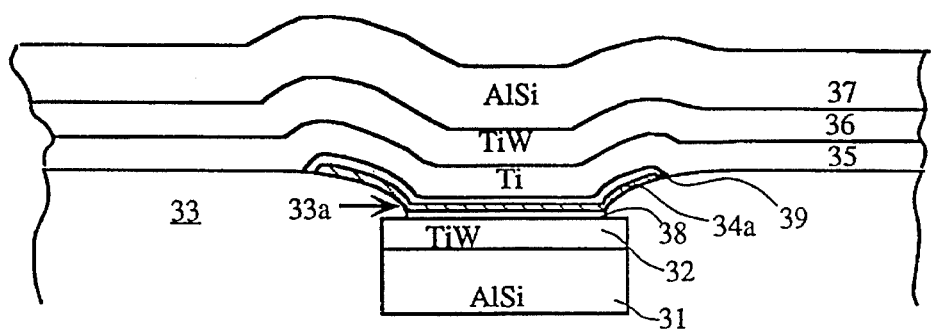
FIG. 3 shows an antifuse structure according to the present invention.

FIG. 3 shows an antifuse structure according to one embodiment of the present invention. The process begins with a lower conductive line 31 of aluminum, aluminum-silicon alloy, or aluminum-silicon-copper alloy on which is formed a titanium-tungsten refractory layer 32. As in the prior art, a layer of oxide 33, for example silicon dioxide, is formed on the structure comprising lower conductive layers 31 and 32. Oxide layer 33 is patterned to expose contract region 33a.

At this point, the structure is treated with an oxygen plasma for about 60 minutes, during which time the temperature of the structure will rise. The combination of elevated temperature and reactive oxygen plasma produces a thin layer of native oxide 38, which is believed to be titanium oxide, tungsten oxide or a mixture of the two, above the contact opening. Amorphous material 34 is formed next, and may be amorphous silicon formed by using pure silane gas. However, preferably, the amorphous material 34 is formed from placing the structure into a mixture of silane gas ($SiH_4$) and nitrogen ($N_2$) at a temperature of 300° C. Composition of the material is an amorphous silicon with about 25 atomic percent nitrogen. In order to improve the amorphous nature of the antifuse material (breaking up any small crystals) and thereby reducing leakage, an argon implant is performed. Other dopants such as silicon, oxygen, or arsenic may alternatively be used. A dosage of $10^{16}$ atoms per $cm^2$ at a voltage of 35 KeV is found to work well. Antifuse 34a is defined using standard IC processing, for example positive photoresist patterned using a mask to expose the openings, removing the exposed photoresist, and etching away the amorphous silicon with wet etch or plasma etch. At this point the structure is passed through another oxygen plasma process for about 60 minutes, forming native oxide layer 39. Because of ion bombardment in the plasma, the temperature of the structure will rise. The R.F. power supplied to the plasma will affect the ambient temperature. A power of 700 watts has produced successful results. An upper contact of titanium 35 covered by titanium-tungsten 36 and finally aluminum, aluminum-silicon alloy, or aluminum-silicon-copper alloy 37 is formed, as before.

Figure 4:
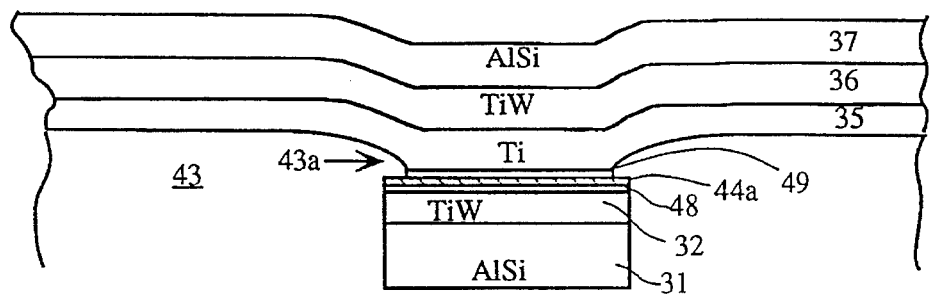
FIG. 4 shows an antifuse structure according to another embodiment of the present invention.

FIG. 4 shows an alternative embodiment in which thin oxide layer 48 is formed by oxidizing titanium-tungsten layer 32 and amorphous silicon layer 44 is formed on oxide layer 48 before layers 31 and 32 are patterned. Layers 31 and 32, are patterned in one patterning step. Thin oxide layer 48 is formed. Antifuse layer 44 is formed and patterned separately, following which, field oxide layer 43 is formed, and opening 43a is patterned. Like amorphous layer 34 of FIG. 3, amorphous layer 44 is implanted with a dopant such as argon, to improve the amorphous structure of the material. The structure is then passed through oxygen plasma as is done to form oxide layer 39, this time forming thin oxide layer 49 in via 43a. Subsequent process steps are the same as discussed above in connection with FIG. 3. This embodiment has the advantage of avoiding the step coverage problem which may occur which forming amorphous silicon layer 34 on the combination of this oxide 38 and field oxide 33.

With the processes discussed in connection with FIGS. 3 and 4, the yield of unprogrammed antifuses is good, and leakage is low enough that the amorphous layer may be in the range of 200–800 Å, and preferably on the order of 450 Å thick. Programming voltage need be only about 7.5 to 10 volts, depending upon selected layer thickness. Standard transistors can resist the antifuse programming voltage; thus the transistors can be small, density is high, and no special transistor processing steps are needed. As a further advantage, the on-resistance of the antifuse will be low due to the shorter length of the conductive filament extending through the antifuse which is formed during programming. Further, the on-resistance value has been found to be stable under current stress over a considerable time of many hours.

Other embodiments of the invention will become obvious to those skilled in the art in light of the above disclosure. Such embodiments are intended to fall within the scope of the claims.

We claim:

1. An antifuse structure comprising:

a first conductive layer including a refractory metal;

a first oxide layer comprising an oxide of said refractory metal;

an amorphous silicon layer formed on said first oxide layer;

a second oxide layer comprising an oxide of said amorphous silicon layer; and a second conductive layer formed on said second oxide layer, wherein said antifuse structure provides a programming voltage range of approximately 7.5 volts to approximately 10.0 volts.

2. The antifuse structure of claim 1 wherein said amorphous layer includes amorphous silicon and nitrogen.

3. The antifuse structure of claim 2 wherein said amorphous layer is implanted with atoms, wherein said atoms include: argon, silicon, arsenic, oxygen, or phosphorus atoms.

4. The antifuse structure of claim 2 wherein said amorphous layer is implanted with atoms capable of breaking up small crystals.

5. The antifuse structure of claim 1 wherein said amorphous layer has a thickness range between 200 Å and 800 Å.

6. The antifuse structure of claim 1 wherein said refractory metal includes titanium-tungsten.

7. The antifuse structure of claim 1 further comprising a field oxide region adjacent said first oxide layer.

8. The antifuse structure of claim 1 further comprising a field oxide region adjacent said second oxide layer.

9. The antifuse structure of claim 1 wherein said amorphous layer includes amorphous silicon.

10. An anti fuse structure comprising:

a first conductive layer including a refractory metal;

a first oxide layer formed from said refractory metal;

an amorphous layer formed on said first oxide layer, wherein said amorphous layer includes amorphous silicon and nitrogen and wherein said amorphous layer has approximately 25 atomic percent nitrogen;

a second oxide layer formed from said amorphous layer; and a second conductive layer formed on said second oxide.

11. The antifuse structure of claim 1 wherein said first conductive layer includes a base layer, said refractory metal formed on said base layer.

12. The antifuse structure of claim 11 wherein said base layer includes aluminum, an aluminum-silicon alloy, or an aluminum-silicon-copper alloy.

13. The antifuse structure of claim 6 wherein said first layer of oxide includes titanium oxide, tungsten oxide, or a combination of titanium oxide and tungsten oxide.

14. The antifuse structure of claim 1 further including a third conductive layer formed over said second conductive layer.

15. The antifuse structure of claim 14 wherein said third conductive layer includes at least one refractory metal.

16. The antifuse structure of claim 15 wherein said at least one refractory metal includes titanium.

17. The antifuse structure of claim 15 wherein said at least one refractory metal includes tungsten.

18. The antifuse structure of claim 15 wherein said third conductive layer further includes at least one non-refractory metal.

19. The antifuse structure of claim 18 wherein said at least one non-refractory metal includes aluminum.

20. The antifuse structure of claim 5 wherein said thickness is approximately 450 Å.

* * * * *

UNITED STATES PATENT AND TRADEMARK OFFICE
CERTIFICATE OF CORRECTION

PATENT NO. : 5,486,707
DATED : January 23, 1996
INVENTOR(S) : Kevin T. Look and Evert A. Wolsheimer It is certified that error appears in the above-identified patent and that said Letters Patent is hereby corrected as shown below:

Col. 3, line 11, "contract" should read -- contact --.

Col. 3, line 62, the second occurrence of "which" should read -- when --.

Col. 3, line 63, "this" should read -- native --.

Signed and Sealed this

Twenty-second Day of April, 1997

Attest:

BRUCE LEHMAN

*Attesting Officer*  *Commissioner of Patents and Trademarks*